US008331726B2

(12) United States Patent
Stellari et al.

(10) Patent No.: US 8,331,726 B2
(45) Date of Patent: Dec. 11, 2012

(54) CREATING EMISSION IMAGES OF INTEGRATED CIRCUITS

(75) Inventors: Franco Stellari, Yorktown Heights, NY (US); Peilin Song, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 604 days.

(21) Appl. No.: 12/493,686

(22) Filed: Jun. 29, 2009

(65) Prior Publication Data

US 2010/0329586 A1    Dec. 30, 2010

(51) Int. Cl.
*G06K 9/00* (2006.01)
*G06K 9/64* (2006.01)
*G06K 9/36* (2006.01)

(52) U.S. Cl. .......... 382/284; 382/141; 382/274
(58) Field of Classification Search .......... 382/284, 382/141, 278
See application file for complete search history.

(56) References Cited

U.S. PATENT DOCUMENTS

| | | | | |
|---|---|---|---|---|
| 4,755,874 | A * | 7/1988 | Esrig et al. | 348/126 |
| 6,226,392 | B1 | 5/2001 | Bacus et al. | |
| 6,313,452 | B1 * | 11/2001 | Paragano et al. | 250/201.3 |
| 7,245,758 | B2 * | 7/2007 | Blackwood et al. | 382/145 |
| 7,253,946 | B2 | 8/2007 | Bellouard et al. | |
| 7,312,919 | B2 * | 12/2007 | Overbeck | 359/368 |
| 7,330,307 | B2 * | 2/2008 | Steele | 359/391 |
| 7,388,599 | B2 * | 6/2008 | Maddison et al. | 348/79 |
| 7,653,260 | B2 * | 1/2010 | Perz et al. | 382/284 |
| 8,072,589 | B2 * | 12/2011 | Khurana | 356/237.1 |
| 2006/0291042 | A1 * | 12/2006 | Alfano et al. | 359/368 |
| 2008/0240613 | A1 | 10/2008 | Dietz et al. | |
| 2010/0080445 | A1 * | 4/2010 | Polonsky et al. | 382/147 |

OTHER PUBLICATIONS

Chow, SK, et al. "Automated microscopy system for mosaic acquisition and processing", Journal of Microscopy-Oxford, May 2, 2006, vol. 222, pp. 76-84, Blackwell Publishing, Oxon, England, Abstract only.
Potsaid, B., et al., "Design of an Adaptive Scanning Optical Microscope for Simultaneous Large Field of View and High Resolution", Proceedings of the 2005 IEEE International Conference on Robotics and Automation, 2005, pp. 460-465.
Steckhan, D. et al., "Efficient large scale Image Stitching for Virtual Microscopy", 30th Annual International IEEE EMBS Conference, Aug. 20-24, 2008, pp. 4019-4023.
Appleton, B. et al., "Towards Optimal Image Stitching for Virtual Microscopy", Proceedings of the Digital Imaging Computing: Techniques and Applications (DICTA 2005), IEEE.

* cited by examiner

*Primary Examiner* — Bhavesh Mehta
*Assistant Examiner* — Utpal Shah
(74) *Attorney, Agent, or Firm* — Scully, Scott, Murphy & Presser, P.C.; Anne V. Dougherty, Esq.

(57) ABSTRACT

A method, system and computer program product are disclosed for creating an image from a device. In one embodiment, the method comprises acquiring first and second images from the device, said first and second images having overlapping portions, and estimating said overlapping portions to obtain an approximate shift amount to align approximately said first and second images. This method further comprises analyzing the overlapping portions, using a defined cross-correlation algorithm, to calculate a precise shift amount to align the first and second images; and using said precise shift amount to join the first and second images together. In one embodiment, an optical system is used to acquire the images, a stage is used to move either the device or the optical system to acquire the first and second images, and the estimating includes using movement of the stage to estimate the overlapping areas.

25 Claims, 14 Drawing Sheets

CREATING EMISSION IMAGES OF INTEGRATED CIRCUITS

BACKGROUND OF THE INVENTION

1. Field of the Invention

This invention generally relates to creating images of integrated circuits, and more specifically, the invention relates to creating emission images of areas of integrated circuits. Even more specifically, an embodiment of the invention relates to creating high resolution emission images of areas of integrated circuits that do not fit in the field of view of the optical system used for acquiring the images.

2. Background Art

Time-integrated images (also called static images) of the intrinsic near infrared emission from integrated circuits (ICs) is widely used to characterize and test VLSI circuits. For example, Light Emission From Off State Leakage Current (LEOSLC) can be measured by static and dynamic photodetectors such as Charge Coupled Device (CCD) cameras and Photo Multiplier Tubes (PMTs). This emission has found applications in, for example, circuit logic state mapping, power grid drop calculation, circuit internal temperature and gate self heating measurements, and across chip performance variation evaluation. More recent applications of both time-integrated and time-resolved emission images of ICs relate to the detection of changes and alterations of ICs. In general the changes may be wanted or unwanted changes. Circuit design changes or manufacture process changes aimed to improve some measurable characteristics of the IC (such as maximum operating frequency, power consumption, reliability, etc.) are examples of wanted changes. Emission-based techniques may be used to verify and characterize these changes. An example of unwanted changes is the intra-chip and inter-chip variation due to manufacturing process variability such dopant fluctuations of transistor thresholds, line edge roughness of transistor dimensions. Another example of unwanted changes pertains to security applications, where alterations of the IC may cause undesirable changes in its behavior. In this case, emission-based methodologies may be used to localize, identify and characterize these changes that may or may not be observed during electrical testing and diagnostics of the IC.

For many types of applications, images of the entire chip are necessary or useful for extracting important information such as the across chip variability maps. However, the continuous need for higher performance and additional chip functionality with lower costs has resulted in aggressive scaling of transistor dimensions as well as an increase of chip area. In this type of application, it is very important to be able to observe very large areas (possibly the entire chip) with a high spatial resolution that allows to identify the changes in the circuit. This poses a challenge to emission acquisition since cameras have a limited number of pixels and therefore the spatial resolution is inversely proportional to the field of view of the optical system. Specifically, if the magnification of the optical system is increased to obtain a suitable spatial resolution, the field of view is inevitably reduced as a side effect. In modern IC design where gates have sub-micron dimension and chip may be 1 in×1 in in size, a compromise has to be found between area coverage and spatial resolution. In current high end products, manufacturers have already reached the point that the emission from the entire chip cannot be acquired with a single acquisition even at the lower possible magnification offered by most optical system/microscopes.

BRIEF SUMMARY

Embodiments of the invention provide a method, system and computer program product for creating an image from a device. In one embodiment, the method comprises acquiring first and second images from first and second areas of the device, said first and second images having overlapping portions, and estimating said overlapping portions to obtain an approximate shift amount to align approximately said first and second images. This method further comprises analyzing said overlapping portions, using a defined cross-correlation algorithm, to calculate a precise shift amount to align the first and second images and using said calculated precise shift amount to join the first and second images together to form a joined image.

In one embodiment, an optical system is used to acquire said images, a stage is used to move either the device or the optical system in order to acquire said first and second images, and the estimating includes using the movement of the stage to estimate said overlapping areas. In one embodiment, the analyzing includes specifying corresponding locations in the overlapping portions, and applying said defined cross-correlation algorithm to said specified locations to calculate said precise shift amount.

For example, an optical system including an array of pixels may be used to acquire said first and second images, and said corresponding locations may be locations on said first and second images corresponding to specified ones of the pixels of said array. As another example, the overlapping portions may include corresponding regions of high emissions, and said corresponding locations in said overlapping portions may be said corresponding regions of high emission.

Different types of algorithms may be used to estimate the amount of fine shift necessary to properly align two neighboring images, or two columns of images, or two rows of images. In one embodiment, a 2D cross-correlation is used, the 2D maximum of the calculated 2D cross-correlation is used, and the coordinates of the maximum are the x and y shift of the image. In another embodiment, a combined methodology of shifting and cross correlation is used. In another embodiment, regions of higher emission within the overlapping area are selected for the algorithm that will be used for matching the images. In another embodiment, the difference of the two overlapping regions may be taken, possibly after adjusting/compensating for differences in emission intensity by using multiplication coefficients, the integral of the absolute value of the difference of each pixel in the overlapping region can be used as a figure of merit of the proper overlapping. By shifting the overlapping regions and calculating the difference for each translation value, a 2D curve of the figure of merit can be calculated. The x and y position of the 2D minimum of such curve can be used as the shift value for the fine adjustment of the overlap.

In an embodiment, filters (image processing) may be applied to the overlapping area in order to reduce the noise. For instance, the two overlapping areas may be averaged to reduce the noise. In another embodiment, the two overlapping areas may be differentiated to locate large isolated peaks that are present only in one of the two overlapping regions but not the other, and these peaks can be removed from the original image.

In one embodiment, an adaptive procedure is used to determine the positions at which the images are taken. In this embodiment, a region of interest is defined, and a first emission image is acquired and stored. That image is analyzed and a suitable overlap region is selected based on the content of the emission itself. The size of the overlap is then used for calculating the position at which the next image is acquired.

DETAILED DESCRIPTION

Figure 1A:
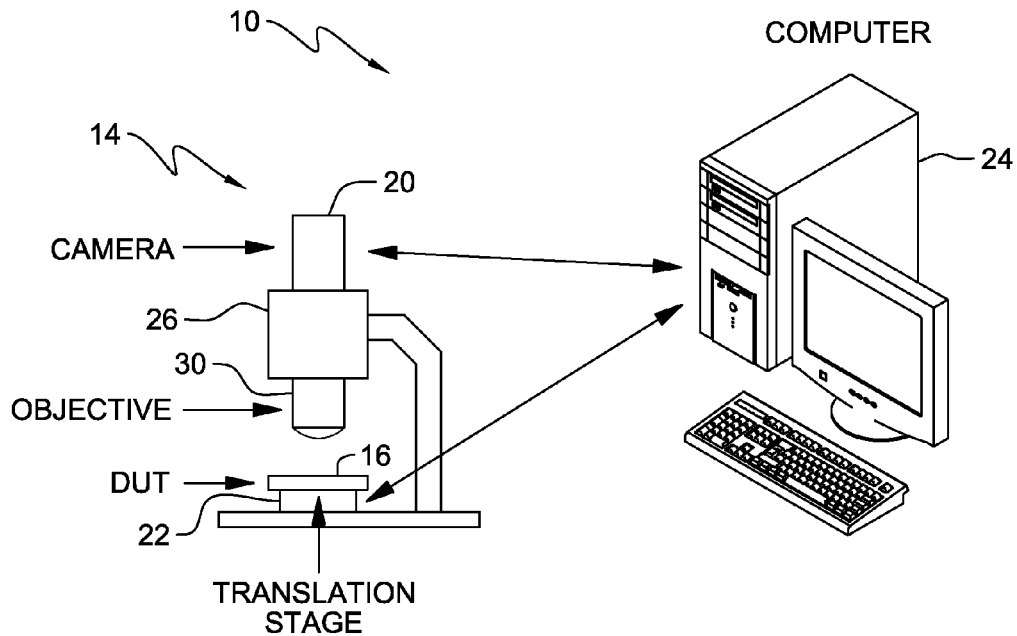
FIGS. 1A and 1B illustrate two embodiments of the present invention.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium, upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. Scientific scripting/programming languages such as Matlab, Mathematica, Octave, etc may also be particularly suited for this purpose because they incorporate advanced image analysis and data manipulation functions. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1B:
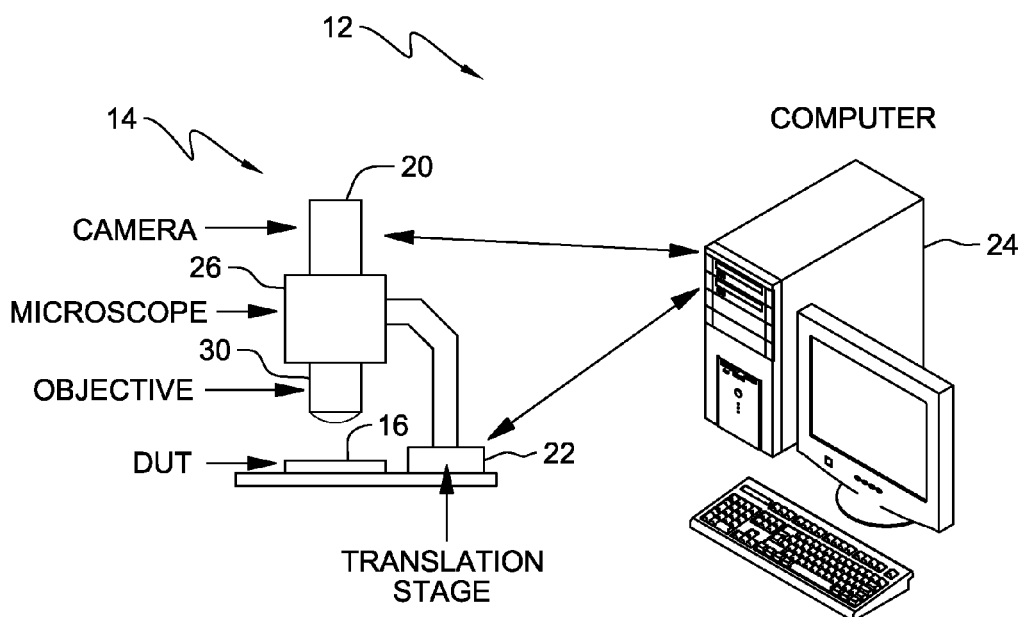

Embodiments of the invention provide a method, system and computer program product for creating high resolution images of the emissions from large areas of integrated circuits. FIGS. 1A and 1B show two embodiments of systems 10, 12 of the invention. Generally, each system includes an optical system 14 for collecting light from a device under test (DUT 16), an imaging detector 20 for measuring the light intensity, a translation stage 22 for moving either the DUT relative to the optical system or the optical system relative to the DUT, and a control unit 24 that controls this movement, the acquisition of the images, and the merging/stitching of the images into a single image with high resolution and large area coverage. The merging/stitching could also be done offline on a different computer in some embodiments.

In these embodiments, the optical system 14 is comprised of a microscope 26 and an objective (or one or more lenses) 30 for collecting the light from the DUT 16. In order to allow for relative movement of the DUT compared to the optical system, either the DUT (as shown in FIG. 1A) or the optical system (as shown in FIG. 1B) is mounted on the translation stage 22. The stage is connected to the control unit 24, which may, for example, be a personal computer that is used to move the stage to the desired positions necessary for the acquisition.

A camera 20 is mounted on the microscope 26 and the collected light is focused on such detector for being acquired. The detector could be of different types such as back-illuminated or intensified Charge-Coupled Devices (CCDs), InGaAs cameras, MgCdTe (MCT) cameras, Photo-Multiplier Tubes (PMTs), as well as additional types of new cameras and materials that are sensitive at the near-infrared region of the spectrum. Different types of cameras may be chosen depending on their spectral response, noise, sensitivity, number of pixels and pixels size. The camera 20 is controlled by the computer 24 that permits to start/stop an acquisition, retrieve the image from the camera and store it in memory or on a disk for further analysis.

The pixel size and the magnification of the objective 30 used by the optical system 14 determines the smallest feature that can be detected in a single acquisition. Also, the size of the detector active area and the objective determine the maximum field of view of a single acquisition. For a given camera, an objective magnification is selected primarily to achieve the desired spatial resolution. For example, let a be the size of the camera pixels and let m×n be the number of pixels for the detector. Therefore, using a magnification equal to M, one could expect to achieve a resolution of a/M and cover a DUT area of am/M×an/M.

Figure 2:
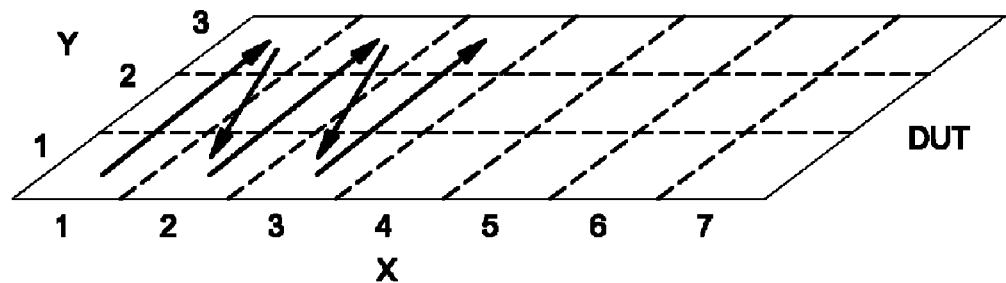
FIG. 2 shows an example of a scanning pattern that may be followed by an optical system to cover a region of interest.
Figure 3:
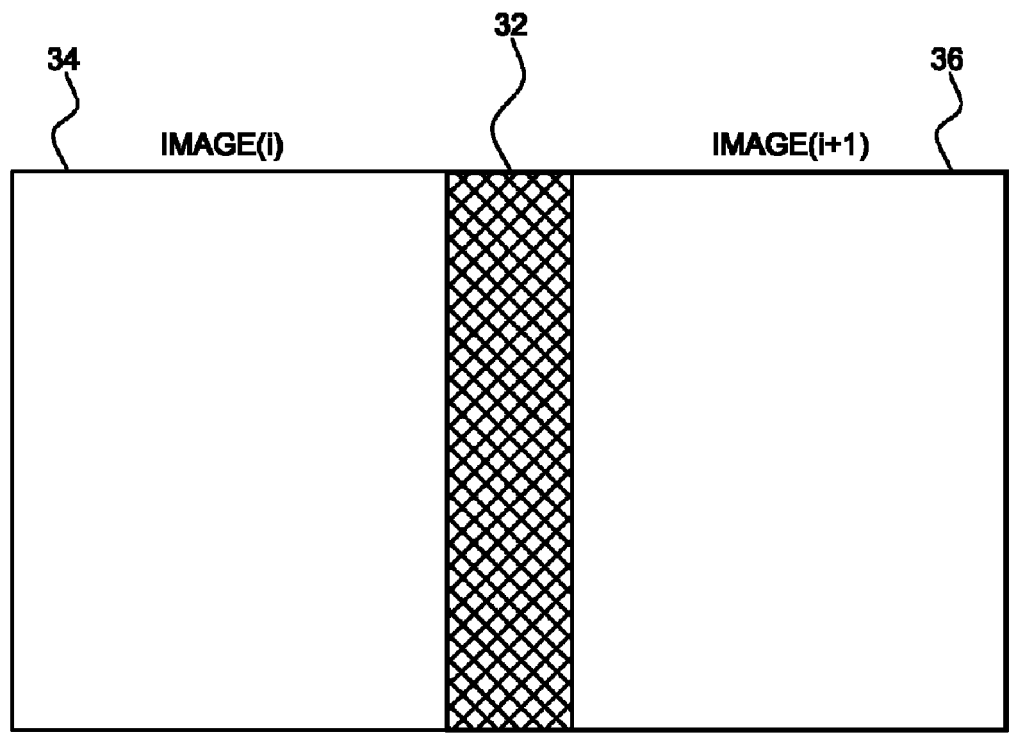
FIG. 3 shows two, overlapping images of neighboring regions of a device under test.

Of particular interest is the case when at such conditions, the area of interest for the acquisition of emission is larger than the field of view of the system, as previously described. In such case, multiple images can be acquired by moving the DUT relative to the optical system. FIG. 2 shows an example of a scanning pattern that may be followed to cover the entire region of interest (other scheme may be followed, including scanning along other directions or a concentric pattern). The movement of the DUT has to be smaller than the field of view of the optical system so that two images (i) and (i+1) of neighboring regions contain an overlapping portion, as shown at 32 in FIG. 3. The computer uses the overlapping area to finely adjust the relative position of each couple of images 34, 36 and subsequently stitch them together to create a larger image with the same spatial resolution of the individual images but with an area larger than the individual images, equal to the entire area covered by the stage movement.

A given objective, optical system and camera combination allows for a certain spatial resolution and field of view of the DUT. Therefore, if a certain magnification is selected for obtaining a desired spatial resolution, the region of interest (ROI) of the DUT may not fit in the field of view of a single emission image. To solve this problem, an embodiment of the invention acquires several, partially overlapping, emission images at the specified resolution, until the entire ROI has been imaged. The individual images are subsequently stitched together by using appropriate programs and methods to obtain a single large image of the emission from the entire ROI at high resolution. To achieve the coverage of the entire ROT by the system, the DUT is moved relative to the optical system (see FIG. 1).

Figure 4:
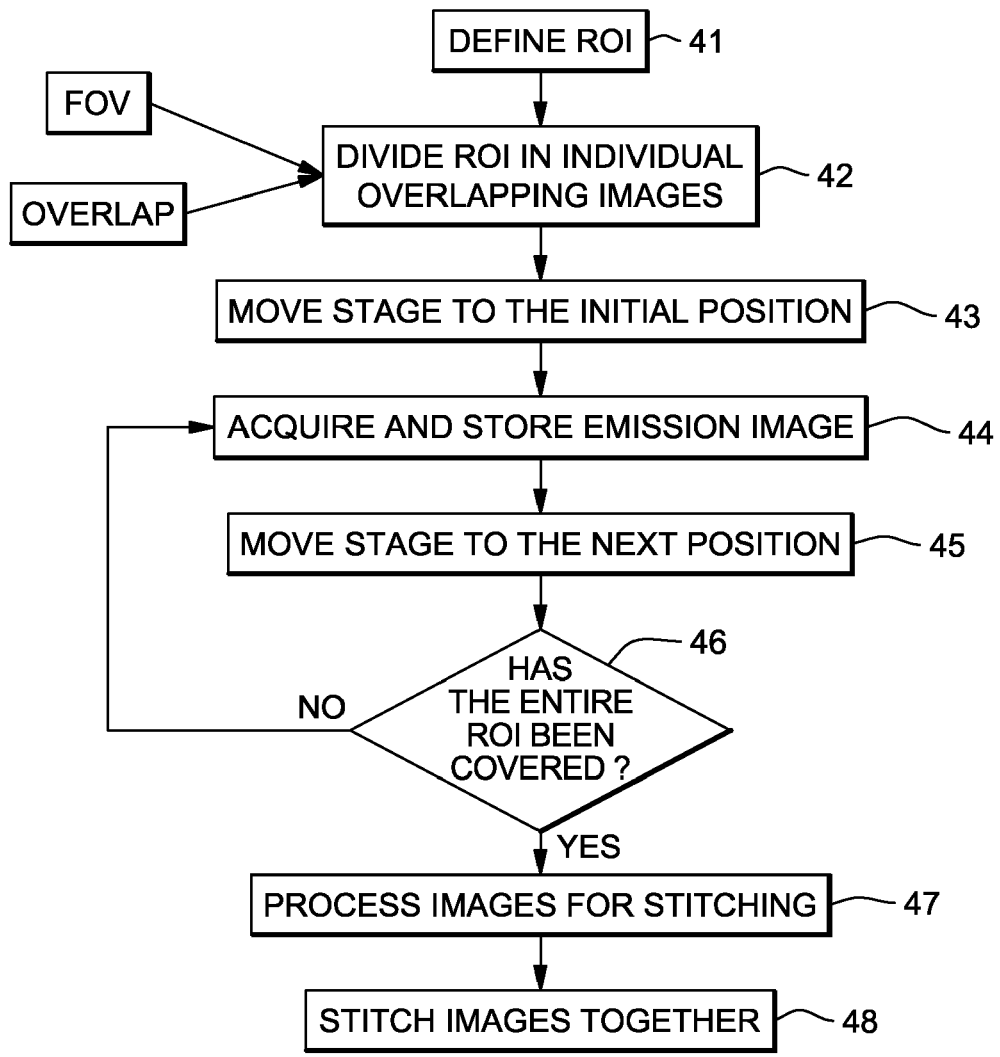
FIG. 4 is a flow chart depicting a method in accordance with an embodiment of the invention.

FIG. 4 shows a schematic diagram of a method according to an embodiment of the invention. At step 41, a ROT is defined by the user where the emission has to be acquired and such ROT is larger than the FOV of the optical system at the magnification necessary for the desired spatial resolution. Based on the FOV and Overlap size, the ROT is subdivided, at step 42, into individual partially overlapping, images. The location of each individual acquisition is computed; and then at step 43, the stage is moved to the first location and then through all the locations, and, as represented at steps 44, 45 and 46, each time the stage is moved, an emission image is acquired and stored for later processing. When the entire ROI has been covered by the acquisitions, the individual images are then processed at step 47, and stitched together at step 48.

It is also possible that while the controller/computer is waiting for the stage to move, and/or a new image acquisition to complete, it works on the merging and stitching of the previously acquired images. For example, the first image is acquired and stored, then the stage moves to the second location. The second image is also acquired and stored. Then a movement to the third location is initiated and in the meanwhile the first two images are processed and merged together. While a new image is acquired, the latest image is merged to the previous one thus creating a partial stitched image. This method could speed up the overall process since 47 and 48 would not need to be done sequentially but in parallel with the stage movement. Another advantage would be to show the user the partially stitched image in real-time so that actions may be taken, such as stop the process, change some parameters, etc.

Figure 5:
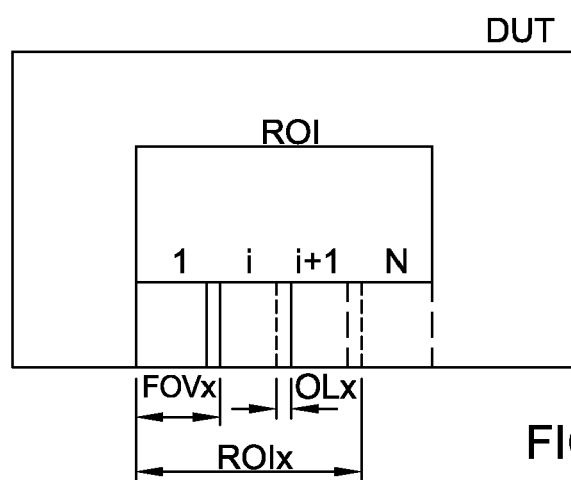
FIG. 5 shows a region of interest of a device under test and illustrates several parameters associated with that region of interest.

The minimum amount of image overlap necessary for proper stitching depends on many factors, including the emission intensity, image quality and emission pattern. Usually one wants to make sure that the overlapping area contains enough features to enable a proper matching and stitching of the images. With reference to FIG. 5, considering one dimension of the ROT (x), calling ROIx the size of the ROT in such direction and FOVx the size of the field of view cover by one image in such direction, the minimum number N of images necessary for covering such dimension is given by N ceil (ROIx/(FOVx−OLx)). OLx is the overlap of the images and the ceil( . . . ) function rounds the number to the next largest integer.

Figure 6:
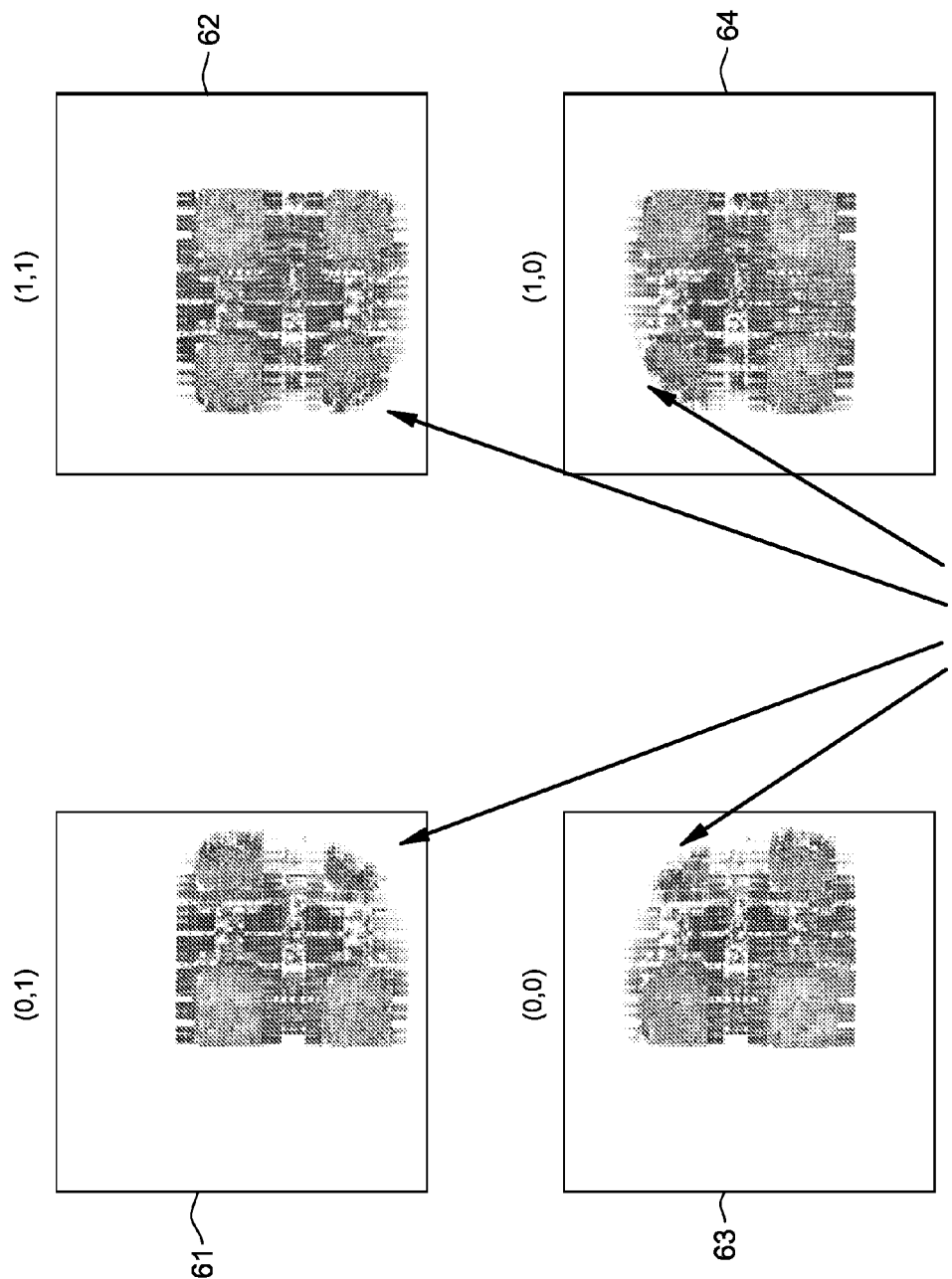
FIG. 6 shows four example emission images from a region of interest.
Figure 7:
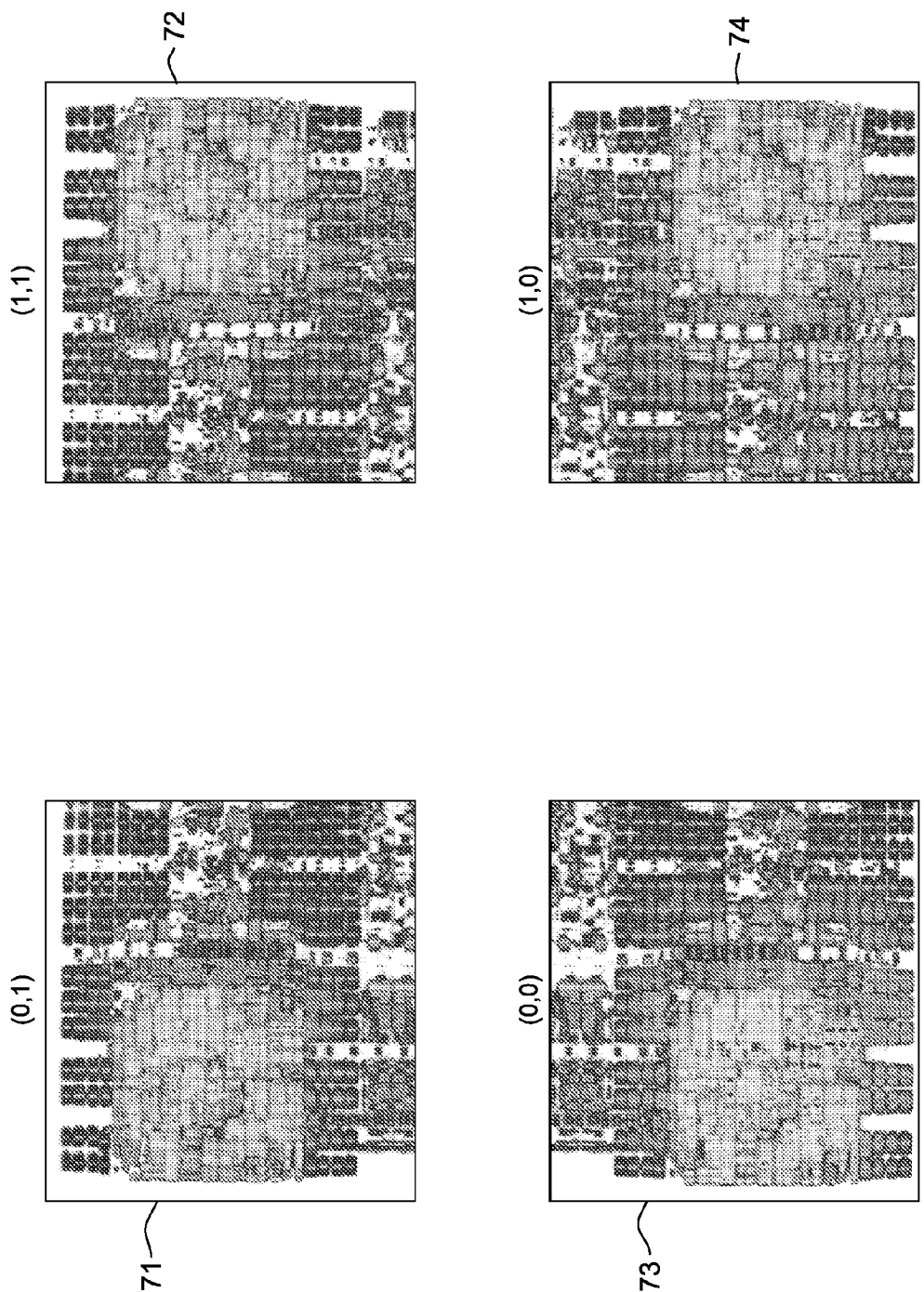
FIG. 7 shows cropped images of a region of interest.

As an example, consider a real life case of emission measurement in which 2×2 images are required to cover the entire ROI. FIG. 6 shows the four images 61, 62, 63, 64 that are acquired to cover the ROI. In this case, aberration and distortion are visible at the edge of the images due to limitations in the optical system. In this case, neighboring images may be cropped on the sides to remove such aberration or distortions of the optical system, thus obtaining the images 71, 72, 73, 74 in FIG. 7. Now consider just the 2 bottom images (namely (0,0) and (1,0) in FIGS. 6 and 7). The overlapping area between the ith and (i+1)th image is estimated based on the knowledge of the stage movement and size of the FOV as indicated by the boxes 81, 82 in FIG. 8. The corresponding overlapping area is then selected in both images 83, 84 for analysis. This step is useful because the movement of the translating stage between two images is only approximately known due to factors such as mechanical limitation, slack in the stage and thermal drifts. Consequently a method is used for finely adjusting the relative position of the two images due to the fixed resolution obtained by the optical system: a shift between the two overlapping region is accurately calculated and used to stitch the two images after finely correcting the stage movement.

Figure 8:
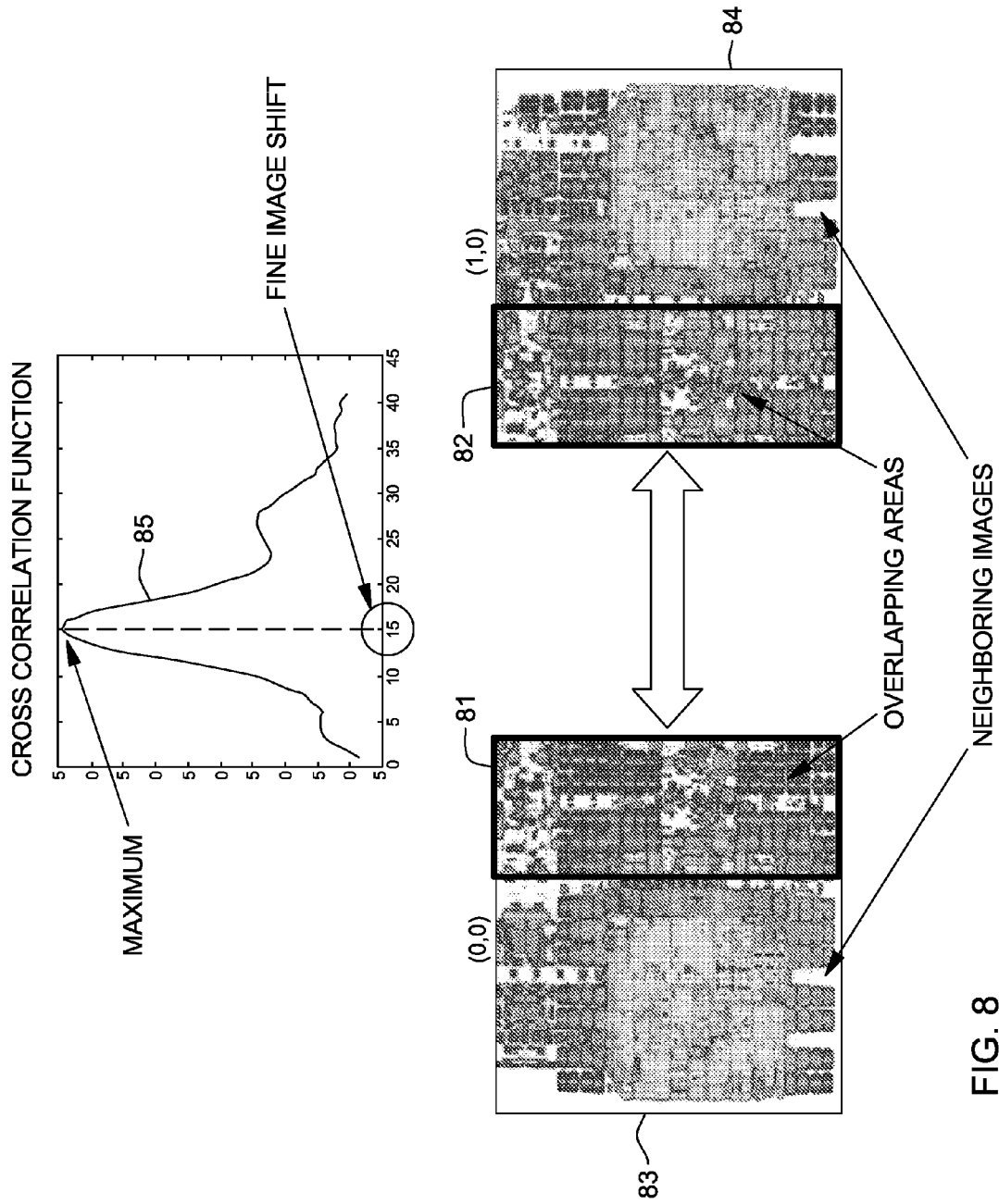
FIG. 8 illustrates a cross-correlation function that may be used to estimate the overlapping area of two neighboring images.
Figure 9:
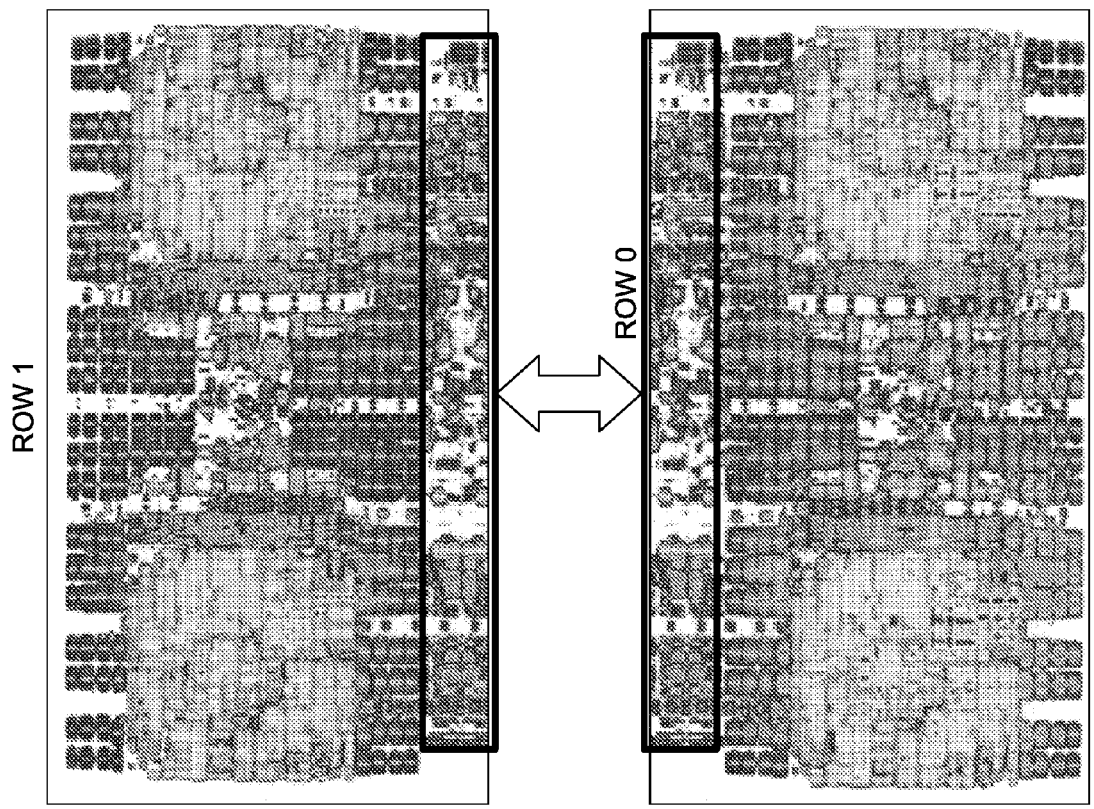
FIG. 9 shows two rows of images that can be stitched together to form a larger composite image.
Figure 10:
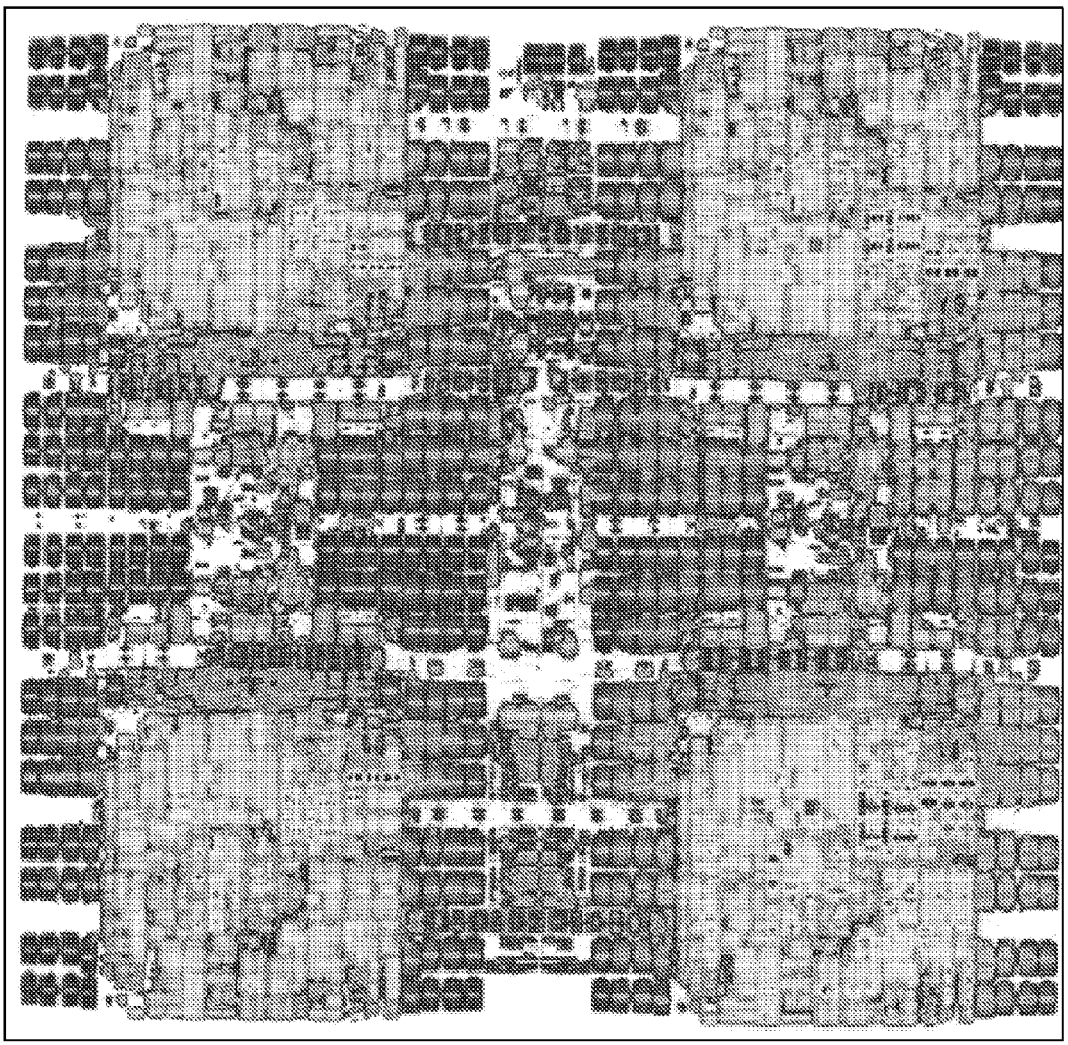
FIG. 10 shows an image formed by combining a number of smaller images in accordance with an embodiment of the invention.

In this case, the cross correlation function of the two overlapping areas is calculated. Curve 85 of FIG. 8 shows an example of cross-correlation considering only the horizontal (x) dimension. The maximum of the cross correlation curve is located and the corresponding location indicates the correct fine shift of the two overlapping areas 81, 82. The stitching process may for example proceed by stitching together all the images in each row of images and then subsequently stitching together the larger images corresponding to the rows, as shown at 90 in FIG. 9. The process is repeated for all the neighboring images in both directions, until a single large image at high resolution is obtained, as shown at 100 in FIG. 10.

A similar result may be achieved by merging first the images in columns and then stitching together the column images. Additionally images may be attached one at a time, without being organized in rows or columns. In this case, the same process used for two images may be used except that one of the two images may be larger and composed of previously stitched images.

Different types of algorithms may be used to estimate the amount of fine shift necessary to properly align two neighboring images, or two columns, or two rows. In one embodiment, a 2D cross-correlation is used, the 2D maximum is used, and the coordinates of the maximum are the x and y shift of the image.

Figure 11:
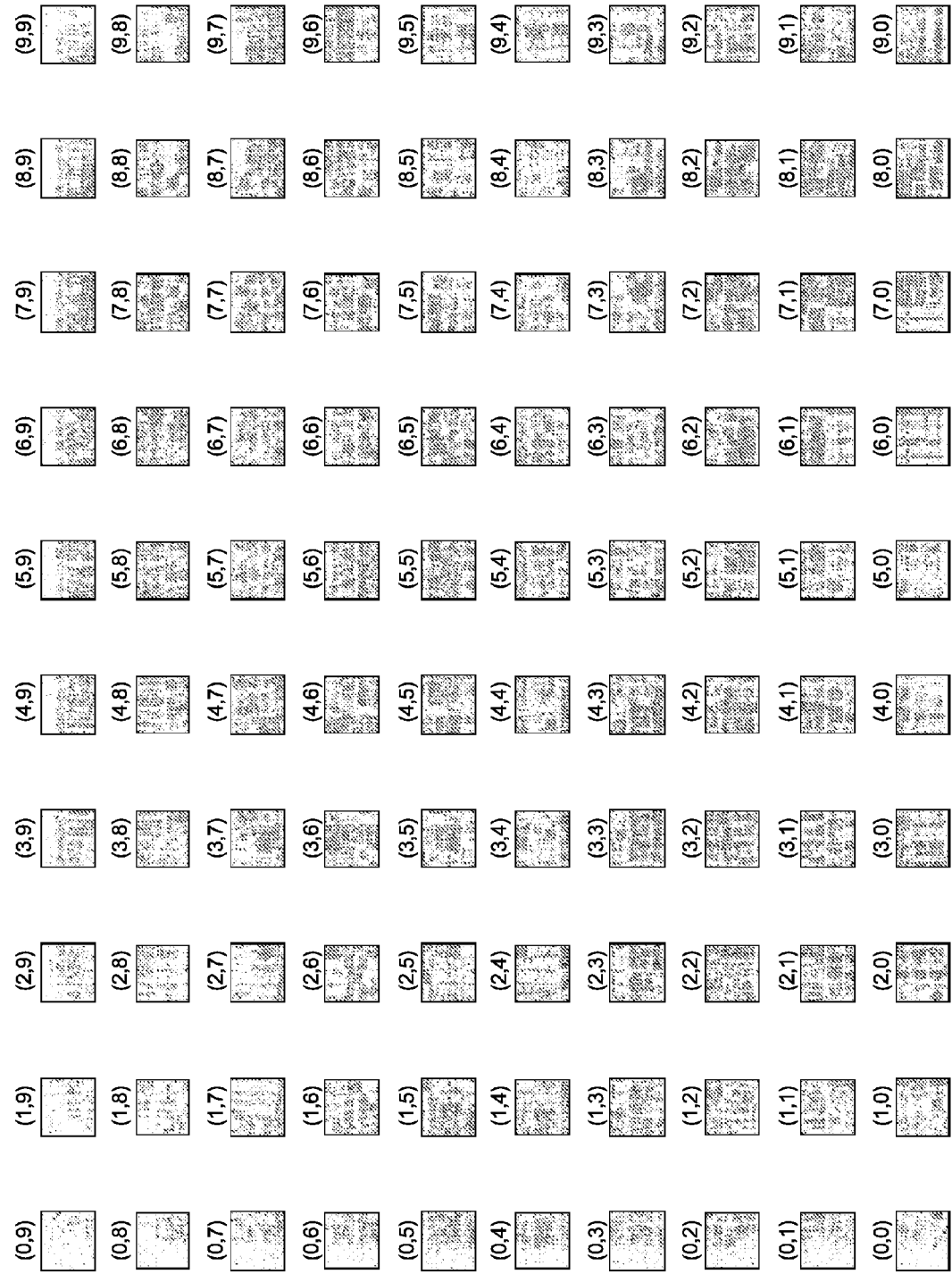
FIG. 11 illustrates a larger number of emission images that can be combined together.
Figure 12:
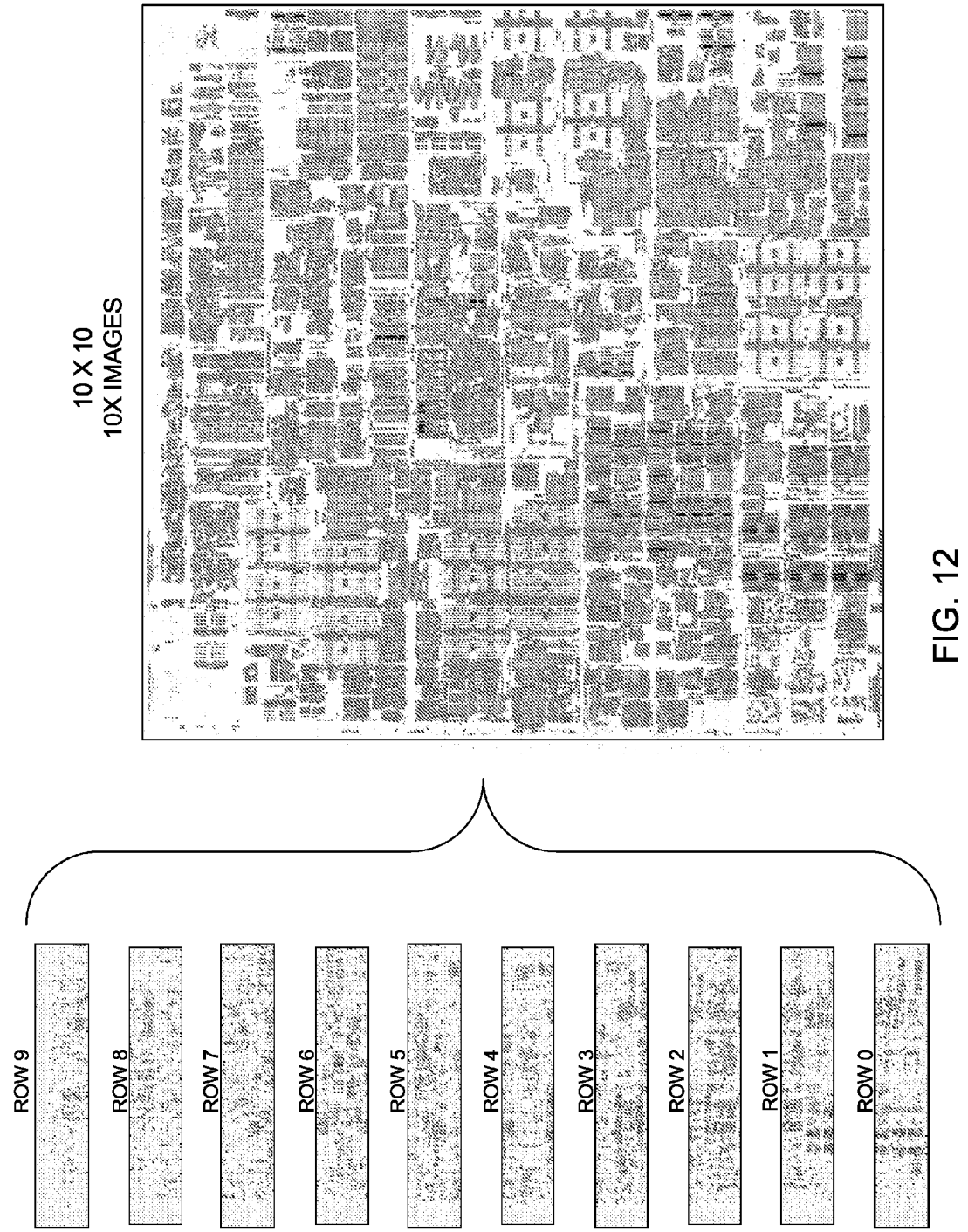
FIG. 12 shows a series of row images, formed from the smaller images of FIG. 11, and a larger, composite image formed from this series of row images.

In another embodiment, a combined methodology of shifting and cross correlation is used. For example, consider the case of stitching together two neighboring images on the same row that have been obtained by moving horizontally the DUT relative to the optical system. In this case, the vertical shift is usually small, while the shift in the direction of the movement is the one with the larger uncertainty. For this reason, a small vertical shift of one image compared to the other may be introduced, and for each pixel shift, the 2D cross correlation of the two overlapping areas is computed, and the maximum is recorded for each shift. After all the allowed shift values have been evaluated in this way, the maximum of all the calculated cross correlation maxima is identified. The vertical shift corresponding to that value is used to shift the images vertically and the horizontal shift is obtained from the cross correlation function corresponding to that value. The use of only a one dimensional cross correlation allows to speed up significantly the matching algorithm for cases where the number of images is large as shown in FIGS. 11 and 12.

In another embodiment, the cross correlation algorithm may be replaced by a differentiation algorithm. After appropriate processing, such as image filtering and adjustment of the intensity levels, the overlapping regions of the two neighboring images are subtracted/differentiated (pixel by pixel), the integral of the absolute value of the difference of each pixel in the overlapping region is computed and can be used as a figure of merit (FOM) of the proper overlapping. By introducing x and y shifts in the relative overlapping region and computing the corresponding FOM for each x and y shift, one can create a 2D curve measuring the quality of the overlap. The minimum of such curve identifies the minimum difference between the two overlapping regions. The x and y coordinate of such minimum correspond to the optimal shift of the two images that offers the best matching.

Figure 13:
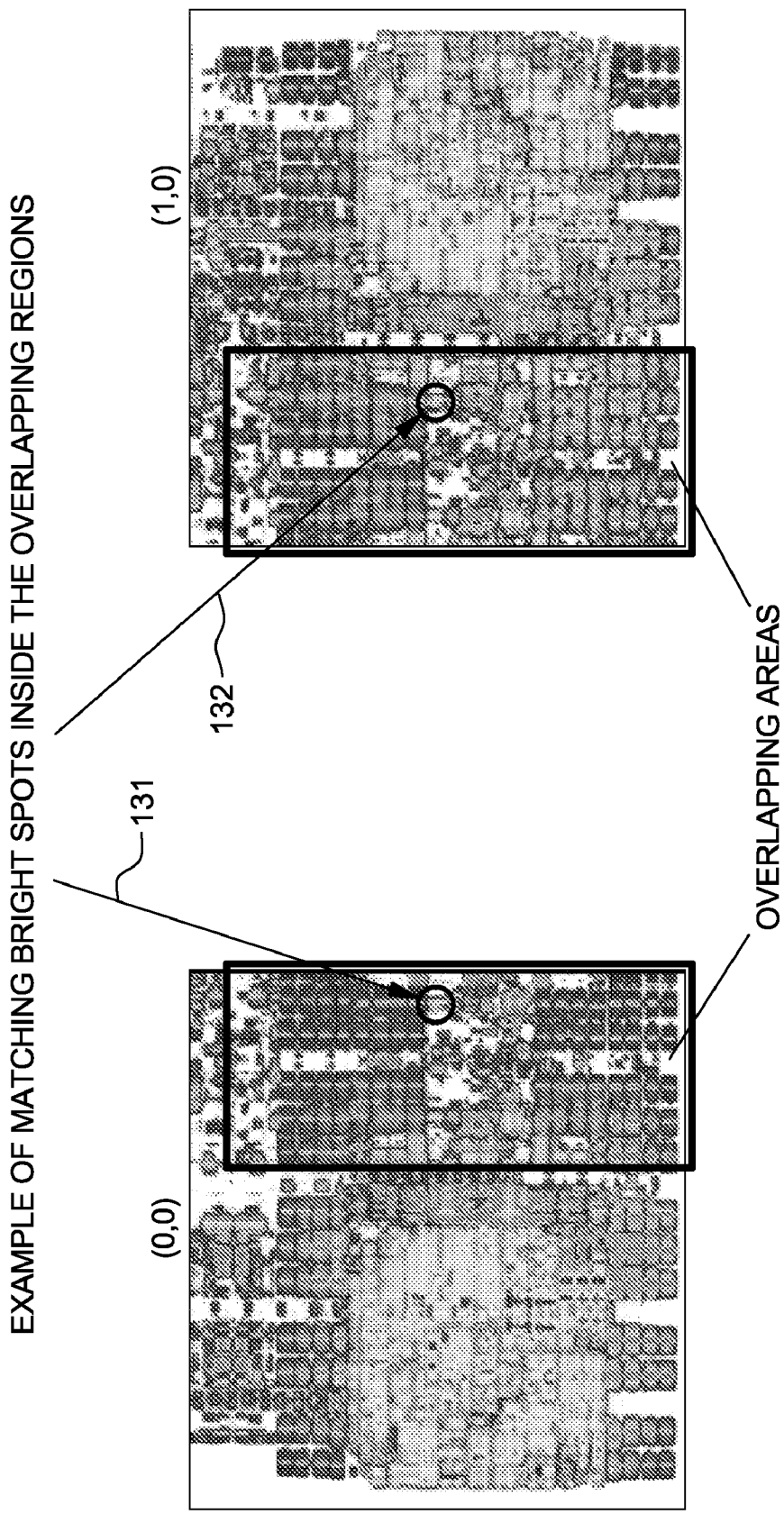
FIG. 13 illustrates one procedure that may be used as a first approximation to match overlapping regions of two images.

In another embodiment, regions of higher emission within the overlapping area are selected for the algorithm that will be used for matching the images (e.g. the cross correlation algorithm). In fact, emission images may be very weak, especially at higher magnifications, and the camera noise as well as spurious emission peaks such as those due to alpha particles may make more difficult the exact matching of the emission on relatively large overlapping areas. Therefore, by selecting regions of higher emission one could have the algorithm work on data with a better signal to noise ratio. Additionally, with reference to FIG. 13, bright spots 131, 132 may be used for a quick, first approximation of the images, followed by a more precise matching algorithm. However, since the gross alignment has been done already, the more precise cross correlation algorithm may be limited to smaller allowed shifts, thus improving the speed even further.

Figure 14:
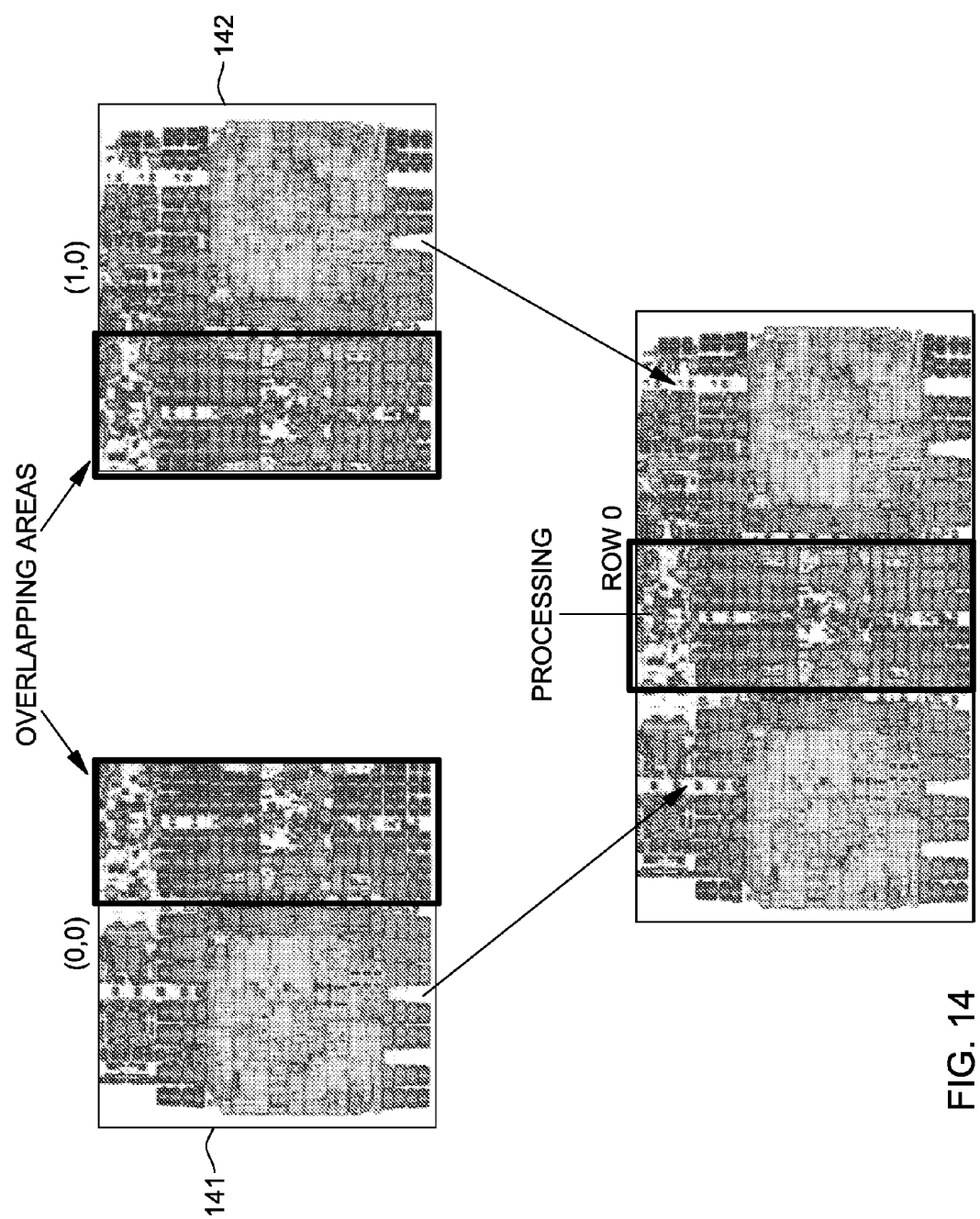
FIG. 14 depicts processing that may be applied to overlapping regions of two images.

With reference to FIG. 14, during the stitching of two neighboring images 141, 142, after the correct shift has been calculated, filters (image processing) may be applied to the overlapping area in order to reduce the noise. In particular, in one embodiment, since the emission from the same area has been acquired twice, the two overlapping areas may be averaged to reduce the noise; if the overlapping areas are a significant portion of the final images, this could significantly improve the overall quality of such final image. In another embodiment, the two overlapping areas are differentiated to locate large isolated peaks that are present only in one of the two overlapping regions but not the other. These peaks are not related to the intrinsic emission from the chip (since they are not in both images) but are due to noise, alpha-particles or artifacts of the camera. Therefore, once identified they can be removed from the original image, thus improving its signal to noise ratio.

As discussed above, an embodiment of the invention provides a method for creating emission images of large areas of a chip at high resolution by stitching together individual images of smaller areas. The method requires the relative movement of the DUT compared to the optical system so that partially overlapping images of the entire ROI are acquired. In this embodiment, the number of images, the overlapping portion and the stage positions at which the images are acquired are predetermined before starting the acquisitions. However, this is not necessary to other embodiments of the invention and may lead to situations where the overlapping region does not contain enough emission feature to allow a desired matching by the cross correlation algorithm.

Figure 15:
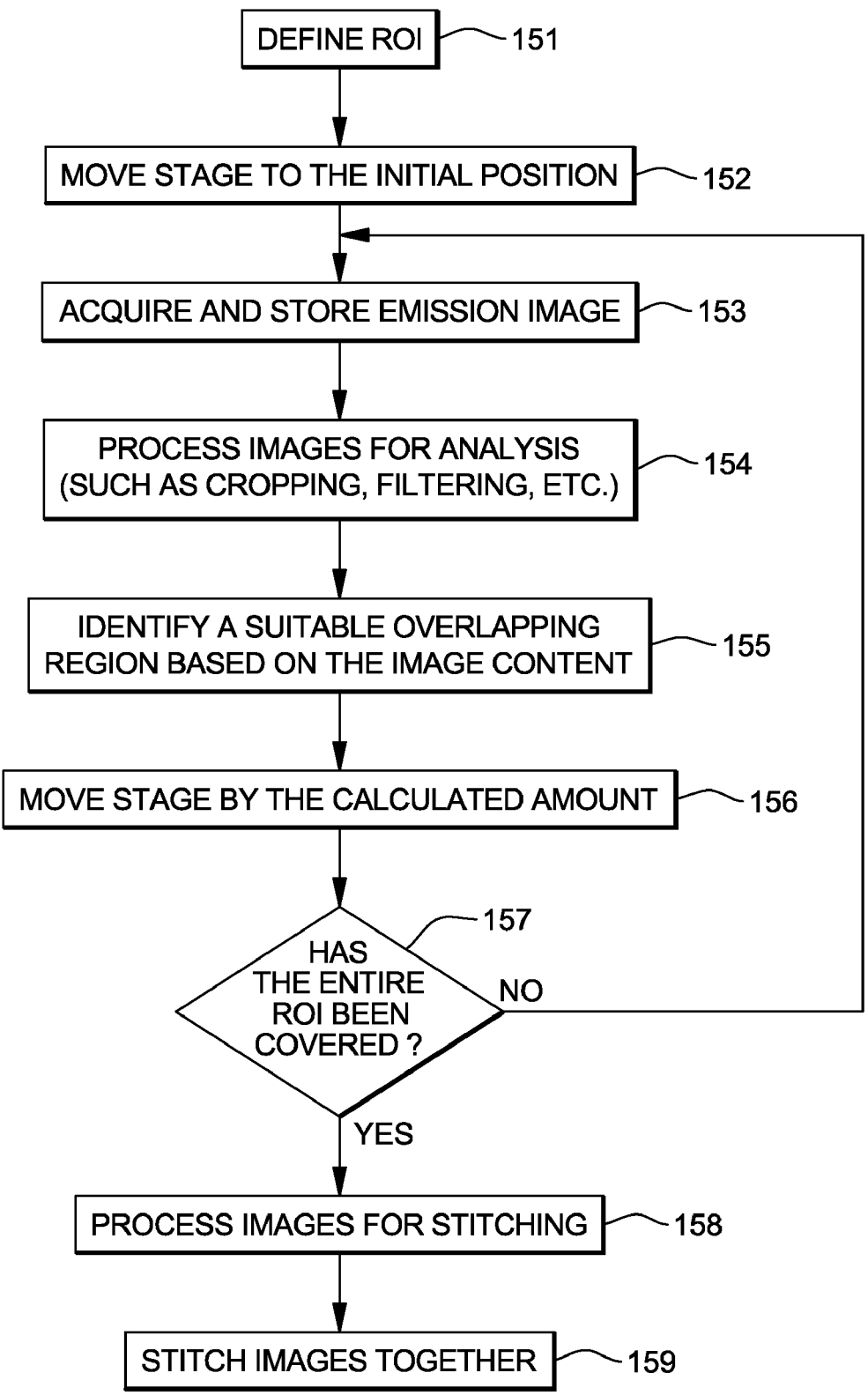
FIG. 15 is a flow chart of an adaptive method, in accordance with an embodiment of the invention, for determining positions at which images are acquired.

To address this, an embodiment of the invention provides an adaptive method described in FIG. 15. In this method, at steps 151, 152, 153, the region of interest is defined, the translation stage is moved to an initial position, and a first emission image is acquired and stored. After the ROI has been defined, and the first image has been acquired, at steps 154, 155 the image is analyzed and a suitable overlap region is selected based on the content of the emission itself. One wants to make sure that there is enough emission and feature inside the overlap region that the cross correlation (or other) algorithm can easily match neighboring images. At step 156 the size of the overlap is then used for calculating the position at which the next image is acquired and the translation stage is moved by the calculated amount. This will continue until the entire ROI has been covered by acquisition, as represented by step 157; and, a represented by steps 158, 159, the final large image may be constructed from the individual acquisitions.

Consider for example the case when the ith image has been acquired and the system has to decide where to move the stage for the (i+1)th image. In this example, the (i+1)th image will be on the right hand side of the ith image. After the ith image has been acquired and before the stage is moved, the right hand side of the ith image is analyzed and a suitable overlap is calculated based on the intensity and feature of the emission in that region. In one embodiment, a minimum amount of emission has to be obtained and the overlap amount is chosen to be the minimum value from the right hand side of the image that guarantees such emission level. In another embodiment, feature (e.g. emission peaks) with a certain amplitude relative to the background have to be obtained. In this case, the overlap region is chosen to be the minimum value that guarantees that those peaks are included in the overlap region. In another embodiment, a combination of methods may be used to define the minimum overlapping region. In all cases, a maximum overlap value may be imposed to avoid making the stage movements too small. Also a certain margin may be added to the calculated overlap to make sure that, due to non idealities in the stage movement (drifts, thermal effects), the desired feature is also visible in the (i+1)th image. Once the overlap value has been calculated, the stage is moved by an amount equal to FOV-OL. The (i+1)th image is acquired and the process proceeds to the next image until the entire ROI has been covered.

Figure 16:
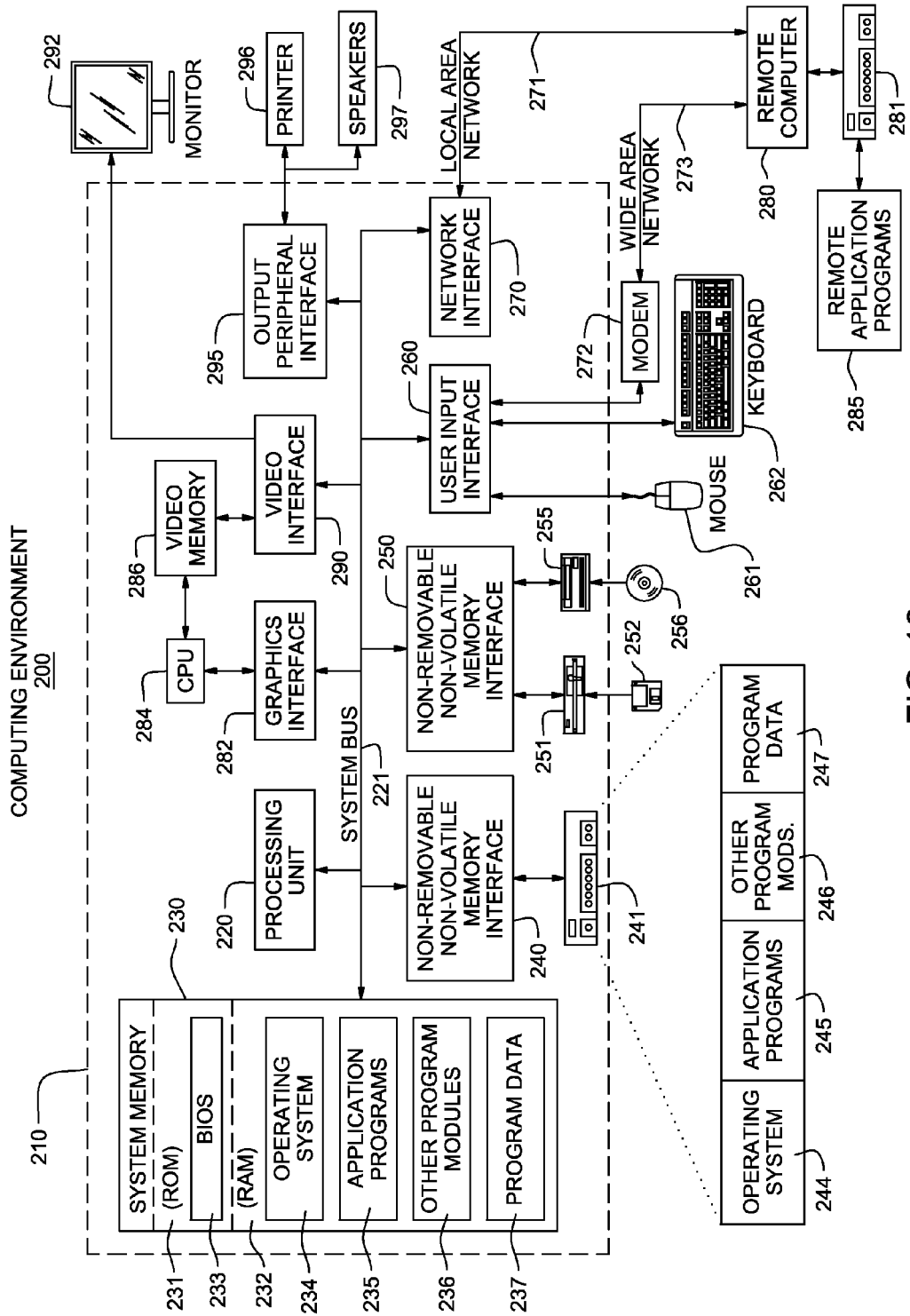
FIG. 16 illustrates a computing environment that may be used in embodiments of the invention.

For example, FIG. 16 and the following discussion provide a brief general description of a suitable computing environment in which the invention may be implemented. It should be understood, however, that handheld, portable, and other computing devices of all kinds are contemplated for use in connection with the present invention. While a general-purpose computer is described below, this is but one example, the present invention may be implemented in an environment of networked hosted services in which very little or minimal client resources are implicated, e.g., a networked environment in which the client device serves merely as a browser or interface to the World Wide Web.

Although not required, the invention can be implemented via an application-programming interface (API), for use by a developer, and/or included within the network browsing software, which will be described in the general context of computer-executable instructions, such as program modules, being executed by one or more computers, such as client workstations, servers, or other devices. Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations.

Other well known computing systems, environments, and/or configurations that may be suitable for use with the invention include, but are not limited to, personal computers (PCs), server computers, hand-held or laptop devices, multi-processor systems, microprocessor-based systems, programmable consumer electronics, network PCs, minicomputers, mainframe computers, and the like. The invention may also be practiced in distributed computing environments where tasks are performed by remote processing devices that are linked through a communications network or other data transmission medium. In a distributed computing environment, program modules may be located in both local and remote computer storage media including memory storage devices.

FIG. 16, thus, illustrates an example of a suitable computing system environment 200 in which the invention may be implemented, although as made clear above, the computing system environment 200 is only one example of a suitable computing environment and is not intended to suggest any limitation as to the scope of use or functionality of the invention. Neither should the computing environment 200 be interpreted as having any dependency or requirement relating to any one or combination of components illustrated in the exemplary operating environment 200.

With reference to FIG. 16, an exemplary system for implementing the invention includes a general purpose-computing device in the form of a computer 210. Components of computer 210 may include, but are not limited to, a processing unit 220, a system memory 230, and a system bus 221 that couples various system components including the system memory to the processing unit 220. The system bus 221 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 210 typically includes a variety of computer readable media. Computer readable media can be any available media that can be accessed by computer 210 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 210.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 230 includes computer storage media in the form of volatile and/or nonvolatile memory such as read only memory (ROM) 231 and random access memory (RAM) 232. A basic input/output system 233 (BIOS), containing the basic routines that help to transfer information between elements within computer 210, such as during startup, is typically stored in ROM 231. RAM 232 typically contains data and/or program modules that are immediately accessible to and/or presently being operated on by processing unit 220. By way of example, and not limitation, FIG. 16 illustrates operating system 234, application programs 235, other program modules 236, and program data 237.

The computer 210 may also include other removable/non-removable, volatile/nonvolatile computer storage media. By way of example only, FIG. 16 illustrate a hard disk drive 241 that reads from or writes to non-removable, nonvolatile magnetic media, a magnetic disk drive 251 that reads from or writes to a removable, nonvolatile magnetic disk 252, and an optical disk drive 255 that reads from or writes to a removable, nonvolatile optical disk 256, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 241 is typically connected to the system bus 221 through a non-removable memory interface such as interface 240, and magnetic disk drive 251 and optical disk drive 255 are typically connected to the system bus 221 by a removable memory interface, such as interface 250.

The drives and their associated computer storage media discussed above and illustrated in FIG. 16 provide storage of computer readable instructions, data structures, program modules and other data for the computer 210. In FIG. 16, for example, hard disk drive 241 is illustrated as storing operating system 244, application programs 245, other program modules 246, and program data 247. Note that these components can either be the same as or different from operating system 234, application programs 235, other program modules 236, and program data 237. Operating System 244, application programs 245, other program modules 246, and program data 247 are given different numbers here to illustrate that, at a minimum, they are different copies.

A user may enter commands and information into the computer 210 through input devices such as a keyboard 262 and pointing device 261, commonly referred to as a mouse, trackball or touch pad. Other input devices (not shown) may include a microphone, joystick, game pad, satellite dish, scanner, or the like. These and other input devices are often connected to the processing unit 220 through a user input interface 260 that is coupled to the system bus 221, but may be connected by other interface and bus structures, such as a parallel port, game port or a universal serial bus (USB).

A monitor 291 or other type of display device is also connected to the system bus 221 via an interface, such as a video interface 290. A graphics interface 282, such as Northbridge, may also be connected to the system bus 221. Northbridge is a chipset that communicates with the CPU, or host-processing unit 220, and assumes responsibility for accelerated graphics port (AGP) communications. One or more graphics processing units (GPUs) 284 may communicate with graphics interface 282. In this regard, GPUs 284 generally include on-chip memory storage, such as register storage and OPUs 284 communicate with a video memory 286. GPUs 284, however, are but one example of a coprocessor and thus a variety of co-processing devices may be included in computer 210. A monitor 291 or other type of display device is also connected to the system bus 221 via an interface, such as a video interface 290, which may in turn communicate with video memory 286. In addition to monitor 291, computers may also include other peripheral output devices such as speakers 297 and printer 296, which may be connected through an output peripheral interface 295.

The computer 210 may operate in a networked environment using logical connections to one or more remote computers, such as a remote computer 280. The remote computer 280 may be a personal computer, a server, a router, a network PC, a peer device or other common network node, and typically includes many or all of the elements described above relative to the computer 210, although only a memory storage device 281 has been illustrated in FIG. 16. The logical connections depicted in FIG. 16 include a local area network (LAN) 271 and a wide area network (WAN) 273, but may also include other networks. Such networking environments are commonplace in offices, enterprise-wide computer networks, intranets and the Internet.

When used in a LAN networking environment, the computer 210 is connected to the LAN 271 through a network interface or adapter 270. When used in a WAN networking environment, the computer 210 typically includes a modem 272 or other means for establishing communications over the WAN 273, such as the Internet. The modem 272, which may be internal or external, may be connected to the system bus 221 via the user input interface 260, or other appropriate mechanism. In a networked environment, program modules depicted relative to the computer 210, or portions thereof, may be stored in the remote memory storage device. By way of example, and not limitation, FIG. 16 illustrates remote application programs 285 as residing on memory device 281. It will be appreciated that the network connections shown are exemplary and other means of establishing a communications link between the computers may be used.

One of ordinary skill in the art can appreciate that a computer 210 or other client device can be deployed as part of a computer network. In this regard, the present invention pertains to any computer system having any number of memory or storage units, and any number of applications and processes occurring across any number of storage units or volumes. The present invention may apply to an environment with server computers and client computers deployed in a network environment, having remote or local storage. The present invention may also apply to a standalone computing device, having programming language functionality, interpretation and execution capabilities.

Thus, methods, systems, and computer program products for inference-driven multi-source semantic search have been described. In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

The invention claimed is:

1. A method of creating an image from a device, comprising:
    defining a region of interest of the device;
    separating said region of interest into a plurality of overlapping areas;
    computing image acquisition locations for each of said overlapping areas;
    using the computed image acquisition locations to acquire first and second images from first and second areas of the plurality of overlapping areas of the device, said first and second images having overlapping portions;

using the computed image acquisition locations for estimating said overlapping portions to obtain an approximate shift amount to align approximately said first and second images;

analyzing said overlapping portions, using a defined cross-correlation algorithm, to calculate a precise shift amount to align the first and second images; and using said calculated precise shift amount to join the first and second images together to form a joined image.

2. The method according to claim 1, wherein the estimating includes estimating the sizes of the overlapping portions.

3. The method according to claim 1, wherein an optical system is used to acquire said images, and a stage is used to move either the device or the optical system in order to acquire said first and second images, and the estimating includes using the movement of the stage to estimate said overlapping areas.

4. The method according to claim 1, wherein the analyzing includes specifying corresponding locations in the overlapping portions, and applying said defined cross-correlation algorithm to said specified locations to calculate said precise shift amount.

5. The method according to claim 4, wherein an optical system including an array of pixels is used to acquire said first and second images, and said correspond locations are locations on said first and second images corresponding to specified ones of the pixels of said array.

6. The method according to claim 4, wherein the overlapping portions include corresponding regions of high emissions, and said corresponding locations in said overlapping portions are said corresponding regions of high emission.

7. The method according to claim 1, wherein the overlapping portions include corresponding regions of high emission, and said estimating includes using said corresponding regions of high emission to estimate said overlapping areas.

8. The method according to claim 1, further comprising processing said overlapping portions to reduce noise therein.

9. The method according to claim 1, wherein the separating said region of interest into a plurality of overlapping areas includes subdividing the region of interest into individual, partially overlapping images based on a field of view of the optical system and an overlap size.

10. A method of creating an image from a device, comprising:
acquiring first and second images from first and second areas of the device, said first and second images having overlapping portions;
estimating said overlapping portions to obtain an approximate shift amount to align approximately said first and second images;
analyzing said overlapping portions, using a defined cross-correlation algorithm, to calculate a precise shift amount to align the first and second images;
using said calculated precise shift amount to join the first and second images together to form a joined image; and
processing said overlapping portions to reduce noise therein, including identifying regions of high emission in one of the overlapping portions that do not have counterparts in the other of the overlapping portions, and removing at least some of said identified regions.

11. A system for acquiring and processing images from a device, comprising:
an optical system for collecting light from the device;
an imaging detector for measuring the intensity of the collected light;
a translation stage for moving the optical system or the device to enable the optical system to take multiple images of different areas of the device; and
a control unit for controlling movement of the translation stage, acquisition of the images, and processing of the images into a combined image; and wherein:
the device includes a defined region of interest separated into a plurality of overlapping areas;
the control unit computes image acquisition locations for each of said overlapping areas, and uses the computed image acquisition locations to position the device relative to the optical system to take said multiple images;
said multiple images include first and second images of first and second areas of the plurality of overlapping areas of the device, said first and second images having overlapping portions; and
the control unit includes functionality for using the computed image acquisition locations for estimating said overlapping portions to obtain an approximate shift amount to align approximately said first and second images,
analyzing said overlapping portions, using a defined cross-correlation algorithm, to calculate a precise shift amount to align the first and second images, and
using said calculated precise shift amount to join the first and second images together to form a joined image.

12. The system according to claim 11, wherein said estimating includes estimating the overlapping portions based on movement of the translation stage.

13. The system according to claim 11, wherein the analyzing includes specifying corresponding locations in the overlapping portions, and applying said defined cross-correlation algorithm to said specified locations to calculate said precise shift amount.

14. The system according to claim 11, wherein:
said multitude of images are acquired in a given sequence, and the control unit includes functionality for,
each of at least selected ones of the multitude of images in the given sequence, determining an overlapping portion for a next image in the given sequence, determining a position for the translation stage to enable acquisition of said next image, and moving the translation stage to the determined position.

15. The system according to claim 11, wherein the determining the overlapping position includes determining the overlapping portion such that the overlapping portion has at least a defined minimum of light emission from the device.

16. An article of manufacture comprising:
at least one tangible computer readable device having computer readable program code logic tangibly embodied therein to execute machine instructions in one or more processing units for acquiring and processing images of a device in an image acquisition and processing system, the device including a define region of interest separated into a plurality of overlapping areas, and the image acquisition and processing systems including an optical system for collecting light from the device, and a translation stage to move the optical system or the device to enable the optical system to take multiple images of different areas of the device, said multiple images including first and second images of first and second areas of the plurality of overlapping areas of the device, said first and second images having overlapping portions, the computer readable program code logic, when executing, performing the following:
computing image acquisition locations for each of said overlapping areas;

using the computed image acquisition locations to acquire said first and second overlapping images;

controlling movement of the translation stage, acquisition of the images, and processing of the images into a combined image, including using the computed image acquisition locations for estimating said overlapping portions to obtain an approximate shift amount to align approximately said first and second images, analyzing said overlapping portions, using a defined cross-correlation algorithm, to calculate a precise shift amount to align the first and second images, and using said calculated precise shift amount to join the first and second images together to form a joined image.

17. The article of manufacture according to claim 16, wherein said estimating includes estimating the overlapping portions based on movement of the translation stage.

18. The article of manufacture according to claim 16, wherein the analyzing includes specifying corresponding locations in the overlapping portions, and applying said defined cross-correlation algorithm to said specified locations to calculate said precise shift amount.

19. The article of manufacture according to claim 16, wherein said multitude of images are acquired in a given sequence, and the method further comprises:

for each of at least selected ones of the multitude of images in the given sequence, determining an overlapping portion for a next image in the given sequence, determining a position for the translation stage to enable acquisition of said next image, and moving the translation stage to the determined position.

20. The article of manufacture according to claim 16, wherein the determining the overlapping position includes determining the overlapping portion such that the overlapping portion has at least a defined minimum of light emission from the device.

21. A method of creating an emission image of an area of an integrated circuit that is larger than a field of view of an optical system used for acquiring the image, the method comprising:

separating said area into a plurality of overlapping sections;

computing image acquisition locations for each of the overlapping sections;

acquiring first and second initial emission images of the plurality of overlapping sections of the integrated circuit, by using an optical system, wherein said first and second initial images have overlapping portions;

using the computed image acquisition locations for determining an approximate shift amount to obtain an approximate alignment of said first and second initial images;

processing at least parts of the first and second initial images, using a defined correlation algorithm, to determine a precise shift amount to align the first and second initial emission images; and forming a composite image by using said precise shift amount to join together the first and second initial images, wherein the optical system has a field of view, and said composite image corresponds to the area of the integrated circuit that is larger than the field of view of the optical system.

22. The method according to claim 21, wherein:

the acquiring includes using relative movement between the integrated circuit and the optical system to acquire said first and second initial images; and the determining includes using said relative movement to determine the approximate shift amount.

23. The method according to claim 21, wherein:

the acquiring includes acquiring a third initial emission image of a corresponding third section of the integrated circuit; and said forming includes forming said composite image while acquiring said third initial emission image.

24. The method according to claim 21, wherein said correlation considers only one dimension of the first and second initial images.

25. The method according to claim 21, wherein the determining the approximate shift include estimating the sizes of the overlapping portions of the first and second initial images.

* * * * *